United States Patent
Urata et al.

(10) Patent No.: US 11,122,233 B2
(45) Date of Patent: Sep. 14, 2021

(54) SOLID-STATE IMAGING DEVICE WITH HIGH RESOLUTION A/D CONVERSION

(71) Applicant: SHARP KABUSHIKI KAISHA, Sakai (JP)

(72) Inventors: Takuji Urata, Sakai (JP); Yoshinao Morikawa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/068,496

(22) Filed: Oct. 12, 2020

(65) Prior Publication Data

US 2021/0120202 A1   Apr. 22, 2021

Related U.S. Application Data

(60) Provisional application No. 62/923,167, filed on Oct. 18, 2019.

(51) Int. Cl.
*H04N 5/378* (2011.01)
*H03M 1/36* (2006.01)

(52) U.S. Cl.
CPC ............. *H04N 5/378* (2013.01); *H03M 1/36* (2013.01)

(58) Field of Classification Search
CPC ..................... H04N 5/378; H03M 1/34–468
See application file for complete search history.

(56) References Cited

U.S. PATENT DOCUMENTS

| | | | |
|---|---|---|---|
| 5,579,006 A | 11/1996 | Hasegawa et al. | |
| 5,748,132 A | 5/1998 | Matsuzawa | |
| 2008/0198049 A1 | 8/2008 | Maruyama | |
| 2015/0189203 A1* | 7/2015 | Araoka ............... | H04N 5/378 |
| | | | 348/302 |

FOREIGN PATENT DOCUMENTS

| | | |
|---|---|---|
| JP | H08-079080 A | 3/1996 |
| JP | H09-093129 A | 4/1997 |
| JP | 2008-182536 A | 8/2008 |

* cited by examiner

*Primary Examiner* — Paul M Berardesca
(74) *Attorney, Agent, or Firm* — ScienBiziP, P.C.

(57) ABSTRACT

Pixels, a charge storage element, a comparison signal generator that generates comparison signals, and a first analog-to-digital converter circuit that performs analog-to-digital conversion are included. The comparison signal generator generates the comparison signals such that a waveform having a voltage value that ranges from an upper limit to a lower limit and that has linearity and continuity is formed by connecting waveforms of the comparison signals to each other.

4 Claims, 13 Drawing Sheets

FIG. 6

ADC PERIOD
(REFERENCE EXAMPLE)

RAMP WAVEFORM

COUNTER  0                                16383

OPERATION DURING
ADC PERIOD-A

RAMP WAVEFORM
                                          VREF

COUNTER  0                                8320

OPERATION DURING
ADC PERIOD-B
                                          VREF

RAMP WAVEFORM

COUNTER  8064                             16383

TO FIG. 7B

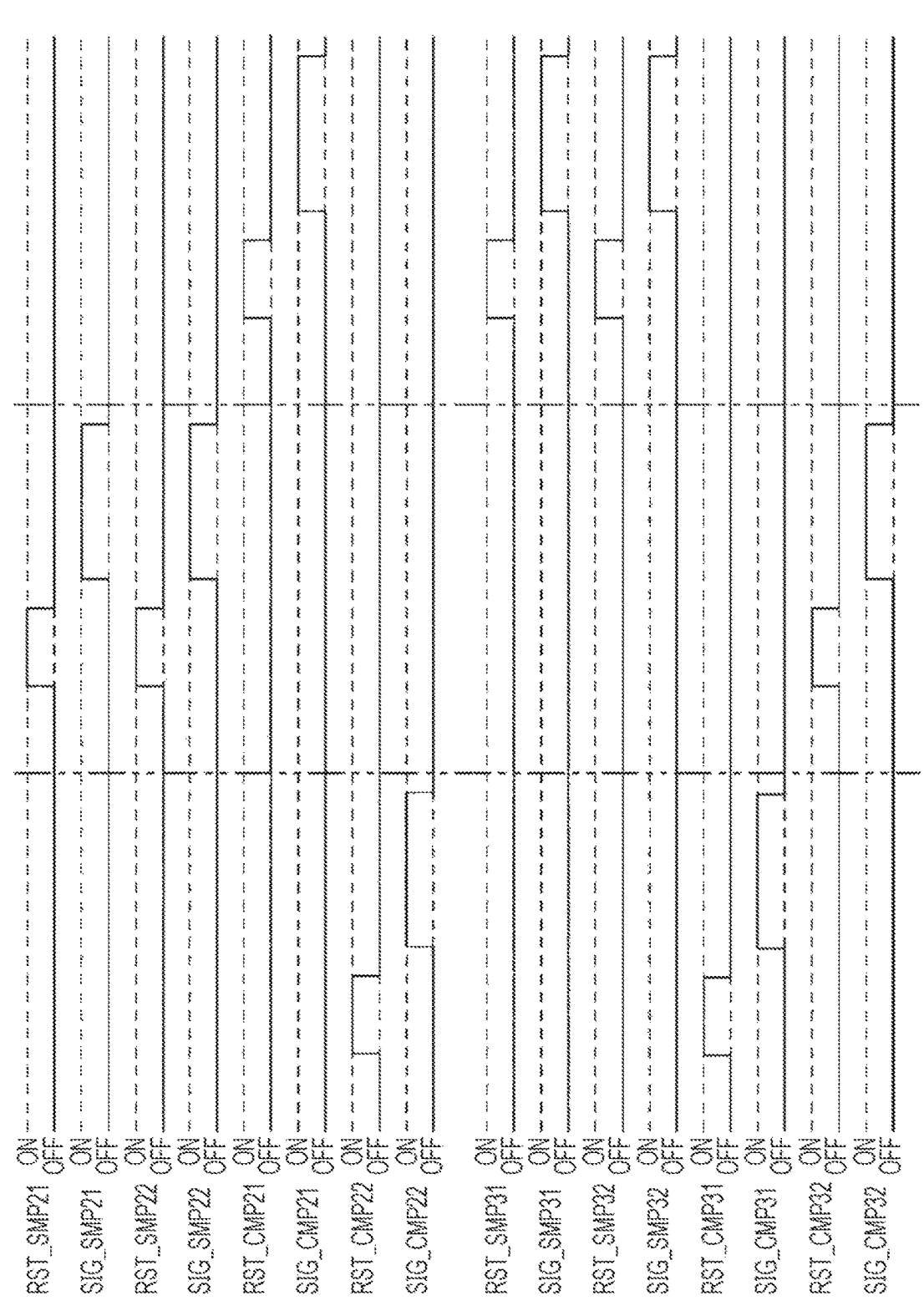

TO FIG. 10B

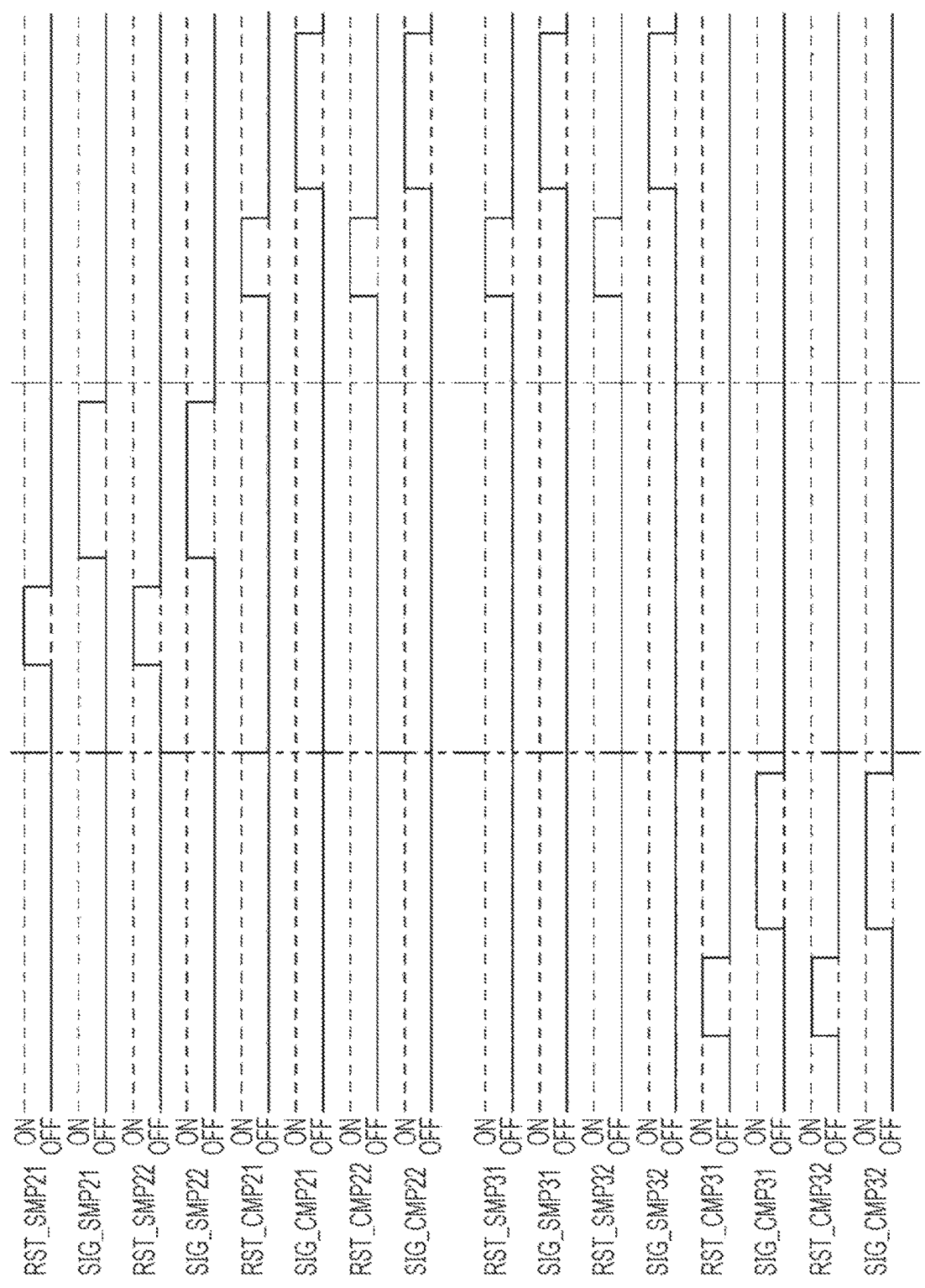

SOLID-STATE IMAGING DEVICE WITH HIGH RESOLUTION A/D CONVERSION

BACKGROUND

1. Field

The present disclosure relates to a solid-state imaging device.

2. Description of the Related Art

In recent years, solid-state imaging devices have been widely used, and the use thereof ranges widely. Among these, CMOS (Complementary Metal Oxide Semiconductor) image sensors can be manufactured by a general purpose semiconductor formation process and are widely used as the solid-state imaging devices. The performance of a solid-state imaging device is desired to be improved, and the processing capacity of analog-to-digital conversion that is performed by the solid-state imaging device is greatly desired to be improved.

An analog-to-digital converter of a solid-state imaging device disclosed in Japanese Patent Publication "Japanese Unexamined Patent Application Publication No. 2008-182536" is a single-slope analog-to-digital converter that compares a variation in a ramp voltage the voltage value of which monotonously varies for a certain period of time with an analog voltage that is converted. Japanese Patent Publication "Japanese Unexamined Patent Application Publication No. 8-79080" discloses a technique for increasing the throughput of an analog-to-digital converter by performing the pipeline operation thereof.

SUMMARY

Regarding the analog-to-digital converter disclosed in Japanese Patent Publication "Japanese Unexamined Patent Application Publication No. 2008-182536", methods described below can be thought to increase analog-to-digital conversion resolution, that is, an analog-to-digital conversion bit number. That is, (i) a method of increasing a counter rate of a counter circuit in conjunction with a shift in the voltage value of a comparison signal that is compared with a pixel output signal, or (ii) a method of prolonging the time of the shift in the voltage value of the comparison signal. However, (i) described above is not technically easy, and (ii) described above has a problem in that improvement in a frame rate is hindered. Even when the pipeline operation of the analog-to-digital converter is performed as disclosed in Japanese Patent Publication "Japanese Unexamined Patent Application Publication No. 8-79080", there are the problems of (i) and (ii) described above.

It is desirable to provide a solid-state imaging device that includes an analog-to-digital converter that has improved analog-to-digital conversion resolution without increasing a counter rate and without prolonging the time of a shift in a comparison signal.

According to an embodiment of the present disclosure, a solid-state imaging device includes pixels, a charge storage element that temporarily stores voltage values of pixel output signals that are outputted from the pixels, a comparison signal generator that generates comparison signals having voltage values that vary in a certain range from an upper limit to a lower limit with time, and a first analog-to-digital converter circuit that performs analog-to-digital conversion by comparing the voltage values that are stored in the charge storage element with the comparison signals. The comparison signal generator generates the comparison signals such that a waveform having a voltage value that ranges from the upper limit to the lower limit and that has linearity and continuity between the upper limit and the lower limit is formed by connecting waveforms that represent variation in the voltage values of the comparison signals with time to each other.

BRIEF DESCRIPTION OF THE DRAWINGS

FIG. 6 illustrates waveforms of two comparison signals that are generated by a comparison signal generator of the solid-state imaging device according to the first embodiment;

FIG. 9A and FIG. 9B illustrate a timing chart illustrating the operation of the analog-to-digital converter of the solid-state imaging device according to the second embodiment; and FIG. 10A and FIG. 10B illustrate a timing chart illustrating the operation of an analog-to-digital converter of a solid-state imaging device according to a third embodiment.

DESCRIPTION OF THE EMBODIMENTS

Figure 1:
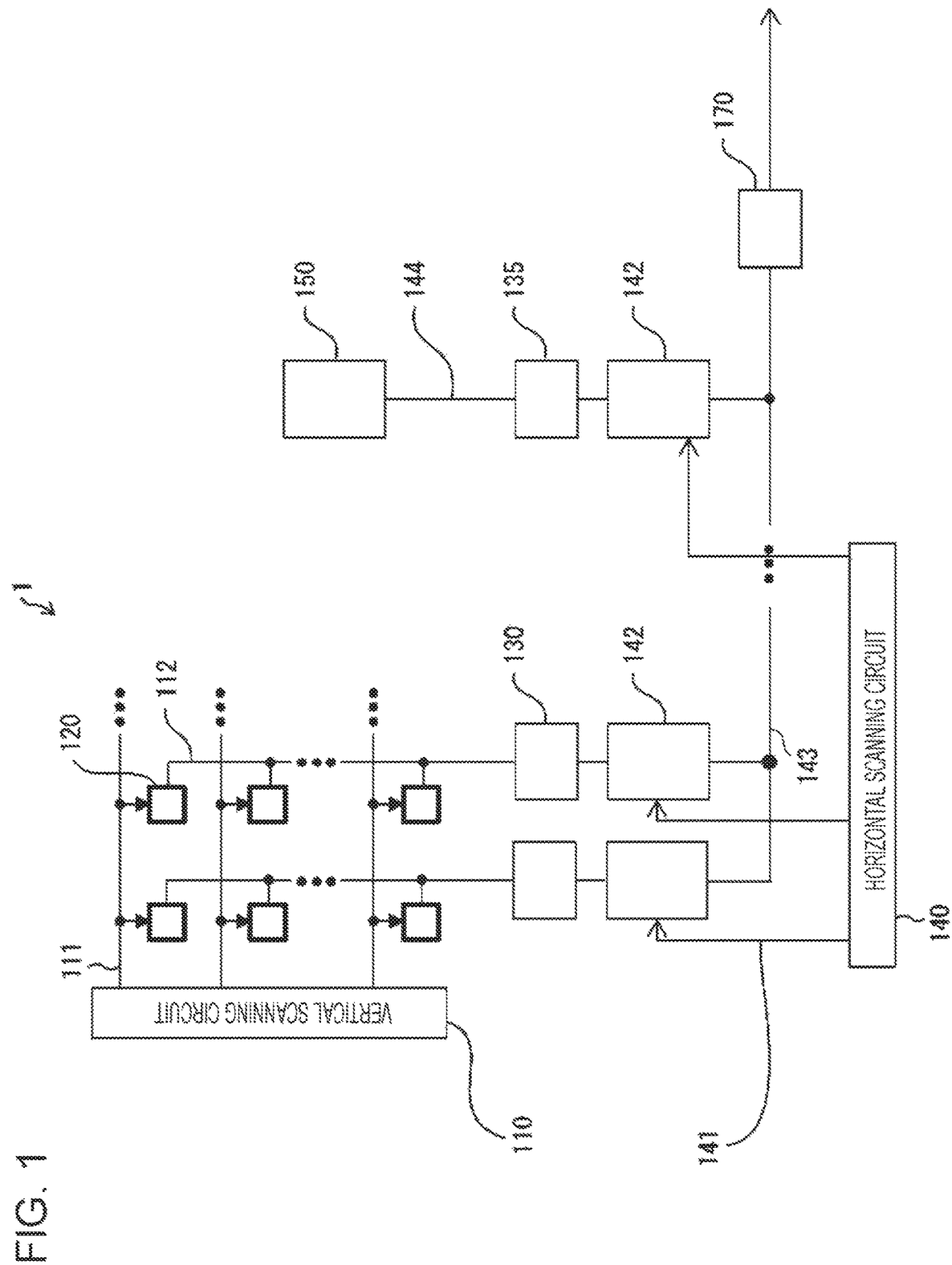
FIG. 1 schematically illustrates a solid-state imaging device according to a first embodiment.

Embodiments of the present disclosure will hereinafter be described based on the drawings. The shapes, relative arrangement, and operations of components described according to the embodiments are just examples, and the scope of the present disclosure is not restrictedly interpreted due to these. The drawings are schematic, and the ratios of dimensions, shapes, and the magnitudes and ratios of numeral numbers differ from those in practice. In the drawings, components like to or corresponding to each other are designated by like reference signs.

According to a second embodiment and a third embodiment described later, for convenience of description, a component having the same function as a component described according to the first embodiment described below is designated by a like reference sign, and a description thereof is not repeated.

First Embodiment

Structure of Solid-State Imaging Device 1
Overview

In a solid-state imaging device 1, as illustrated in FIG. 1, pixels 120 are arranged in a matrix on a flat surface. Row selection signal lines 111 and readout signal lines 112 are connected to the respective pixels 120. A vertical scanning circuit 110 selects rows of the pixels 120 through the row selection signal lines 111 in rows. The pixels 120 in a row that is selected output pixel output signals to the readout signal lines 112 in columns.

The readout signal lines 112 in columns are connected to respective analog-to-digital converters 130. The analog-to-digital converters 130 are connected to respective memories 142. The analog-to-digital converters 130 obtain the pixel output signals from the respective pixels 120 in columns and perform column analog-to-digital conversion in which the pixel output signals are sequentially converted into digital signals, which are outputted.

A reference voltage generator 150 is connected to a reference analog-to-digital converter 135 with a reference signal line 144 interposed therebetween. The reference analog-to-digital converter 135 is connected to the memories 142. The reference voltage generator 150 supplies a reference voltage to the reference analog-to-digital converter 135. The reference analog-to-digital converter 135 performs the analog-to-digital conversion of the reference voltage and generates and outputs a correction digital signal that is used to correct the values of the digital signals corresponding to the pixel output signals.

A horizontal scanning circuit 140 selects columns of the memories 142 through column selection signal lines 141 in columns. The memories 142 that are selected sequentially output the correction digital signal and the digital signals corresponding to the pixel output signals via a horizontal output line 143.

A corrector 170 is connected to the horizontal output line 143. The corrector 170 uses the correction digital signal that is converted by the reference analog-to-digital converter 135 to correct the values of the digital signals corresponding to the pixel output signals that are converted by the analog-to-digital converters 130. The correction will be described later.

According to the present embodiment, the solid-state imaging device 1 is a CMOS image sensor but may be another imaging device such as a CCD (Charge Coupled Device) image sensor.

Structure of Pixel 120

Figure 2:
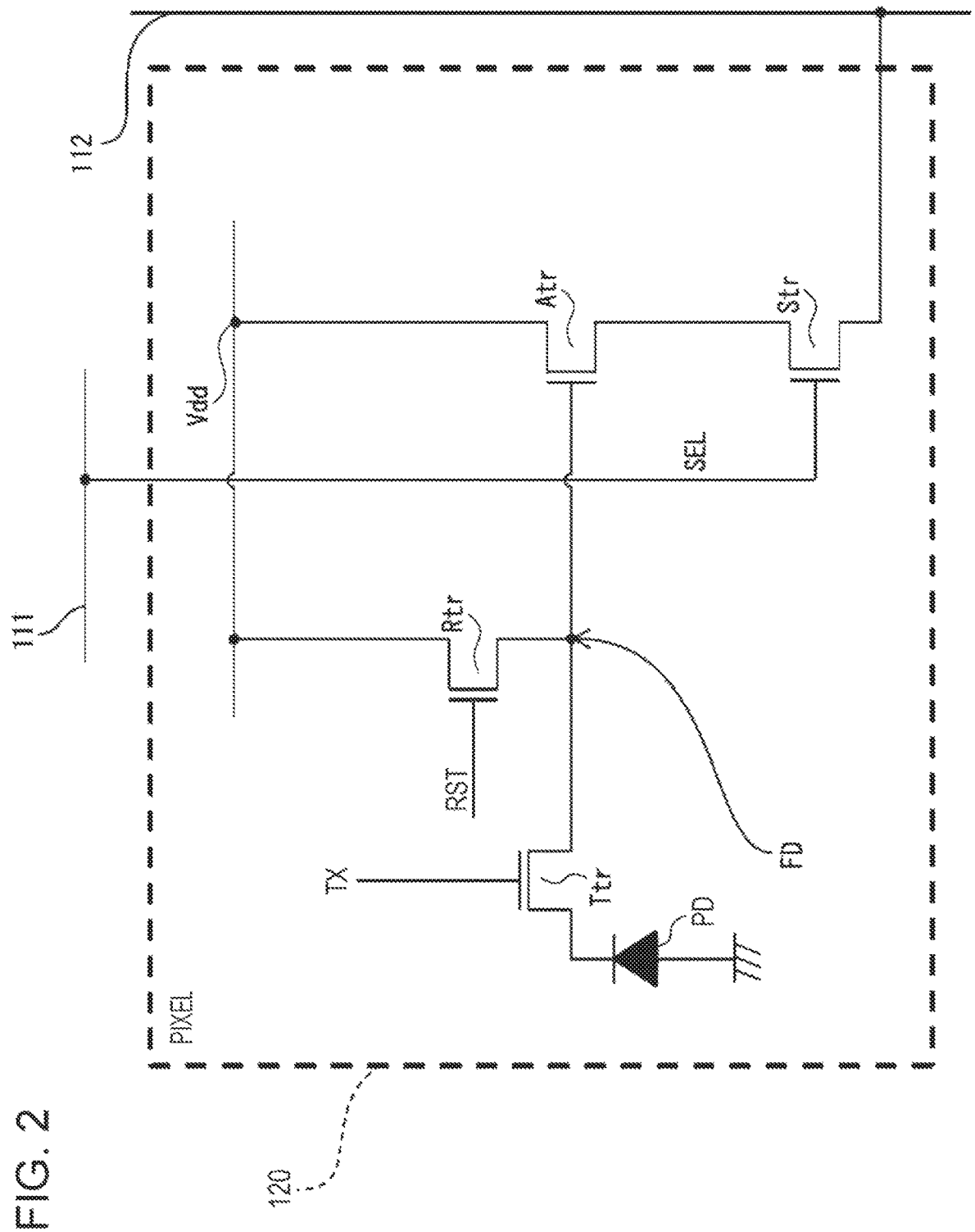
FIG. 2 is a schematic circuit diagram illustrating the structure of a pixel of the solid-state imaging device according to the first embodiment.

As illustrated in FIG. 2, each pixel 120 includes a photodiode PD, a transfer transistor Ttr, a reset transistor Rtr, a selection transistor Str, an amplification transistor Atr, and a signal charge storage portion FD. The pixel 120 is electrically connected to the readout signal line 112, a transfer signal line via which a transfer signal TX is transmitted, a reset signal line via which a reset signal RST is transmitted, the row selection signal line 111 via which a row selection signal SEL is transmitted, and a power-supply power line via which a power-supply voltage Vdd is supplied. In FIG. 1, for simplification of description, an illustration of the reset signal line, a selection signal line, and so on is omitted. The reset signal line, the selection signal line, and so on, the illustration of which is omitted, are signal lines that are arranged in rows as in the row selection signal lines 111.

The reset transistor Rtr discharges signal charges that are accumulated on the signal charge storage portion FD and resets the electric potential of the signal charge storage portion FD to a high potential when turned on in accordance with the reset signal RST. The photodiode PD performs photoelectric conversion and generates the signal charges depending on the amount of received light. Each pixel 120 may include, for example, another kind of light-receiving element and a sensor element instead of the photodiode PD. The transfer transistor Ttr transfers the signal charges that are generated by the photodiode PD to the signal charge storage portion FD when turned on in accordance with the transfer signal TX. The signal charge storage portion FD is a floating diffusion region in which the signal charges are stored. For this reason, the electric potential of the signal charge storage portion FD decreases depending on the amount of the stored signal charges.

In the selection transistor Str, a gate is connected to the row selection signal line 111, a drain is connected to the source of the amplification transistor Atr, and a source is connected to the readout signal line 112. The selection transistor Str is turned on in accordance with the row selection signal SEL, and only the pixels 120 in a row that is selected among the pixels 120 that are included in the solid-state imaging device 1 output the pixel output signals to the readout signal line 112.

The amplification transistor Atr operates as a source follower transistor the source voltage (the output voltage) of which changes and follows a gate voltage (an input voltage) at a fixed voltage gain. In the amplification transistor Atr, a gate is connected to the signal charge storage portion FD, and a drain is connected to the power-supply power line. Consequently, the amplification transistor Atr outputs a signal voltage obtained by amplifying the electric potential of the signal charge storage portion FD to the readout signal line 112 via the selection transistor Str.

The voltage value (the reset electric potential) of a pixel output signal VSIG when the electric potential of the signal charge storage portion FD is reset is referred to as VSIG (RST). The voltage value (the signal electric potential) of a pixel output signal VSIG when the electric potential of the signal charge storage portion FD decreases depending on the amount of the signal charges that are stored in PD is referred to as VSIG (SIG).

Structure of Analog-to-Digital Converter 130

Figure 3:
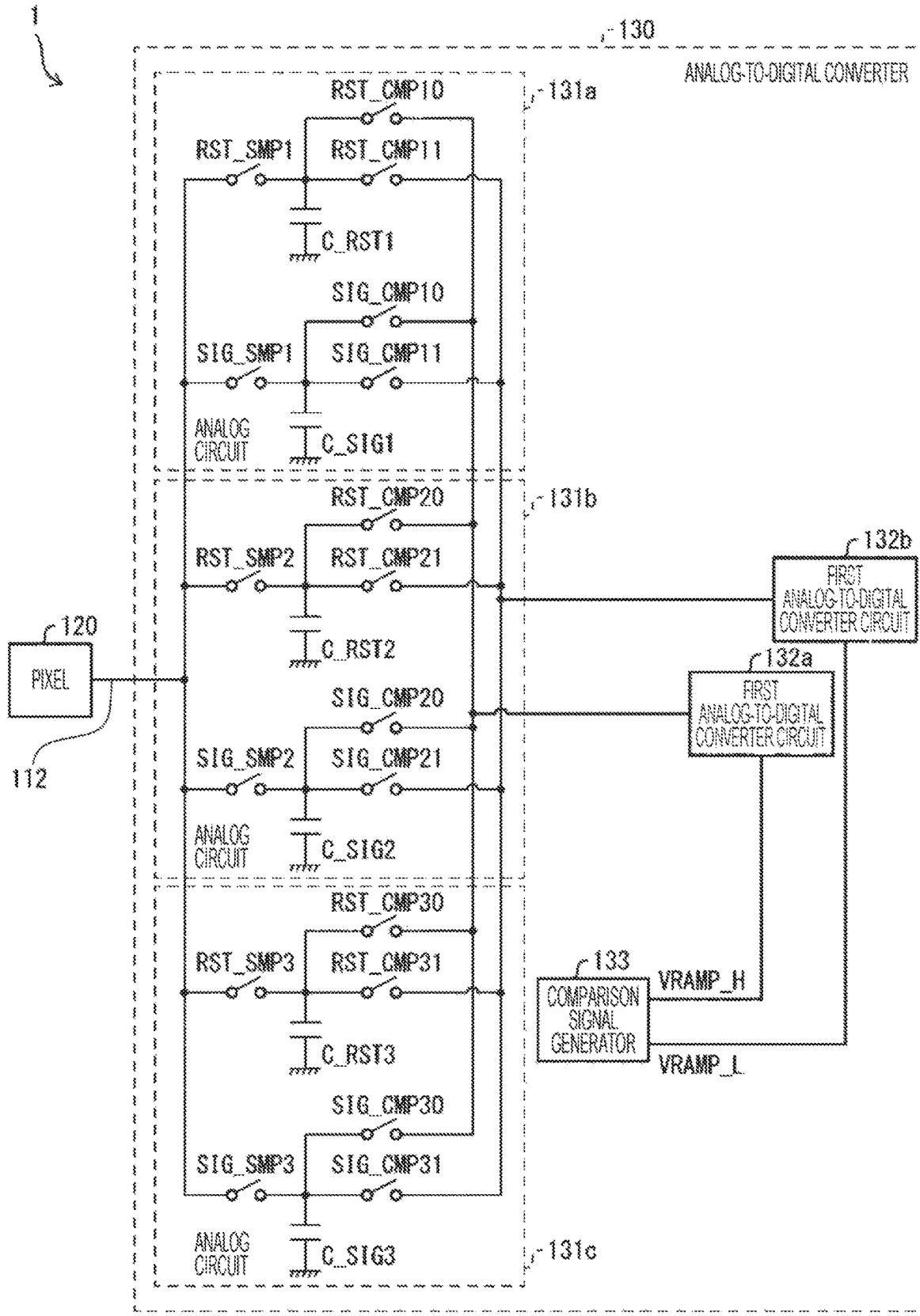
FIG. 3 is a schematic circuit diagram illustrating the structure of an analog-to-digital converter of the solid-state imaging device according to the first embodiment.

As illustrated in FIG. 3, the pixel output signals VSIG are inputted into each analog-to-digital converter 130. The pixel output signals VSIG are analog signals that are outputted from the pixels 120 in a row that is selected by the vertical scanning circuit 110. Specifically, the analog-to-digital converter 130 reads (samples) the signal electric potentials VSIG (SIG) and the reset electric potentials VSIG (RST) that are generated by the pixels 120 in the row that is selected by the vertical scanning circuit 110. VSIG (RST) and VSIG (SIG) are converted into digital signals. The analog-to-digital converter 130 performs correlated double sampling (CDS) operation in which the difference between the two digital signals is obtained and outputs the difference that is obtained by performing the sampling operation as the digital signal of the result of the analog-to-digital conversion.

The correlated double sampling that is performed by the analog-to-digital converter 130 may not obtain the difference between the digital signals but may obtain the difference between the analog signals. In this case, the difference between VSIG (RST) and VSIG (SIG) is obtained as an analog signal before these are converted into the digital signals. The analog-to-digital converter 130 converts the difference between the analog signals into a digital signal and outputs the digital signal as the result of the analog-to-digital conversion.

The analog-to-digital converter 130 includes analog circuits 131a, 131b, and 131c, first analog-to-digital converter circuits 132a and 132b, and a comparison signal generator 133. In the following description, a portion of the analog-to-digital converter 130 near an input terminal is referred to as an input portion, and a portion thereof near a digital output terminal is referred to as an output portion. The analog circuits 131a, 131b, and 131c are collectively referred to as analog circuits 131, and the first analog-to-digital converter circuits 132a and 132b are collectively referred to as first analog-to-digital converter circuits 132 in some cases.

The analog circuits 131 include the three analog circuits 131a, 131b, and 131c that are connected to each other in parallel. The three analog circuits 131a, 131b, and 131c have the same structure. In the analog-to-digital converter 130, the input terminal into which the pixel output signals VSIG are inputted branches and is connected to the analog circuits 131a, 131b, and 131c. The outputs of the analog circuits 131a, 131b, and 131c merge and are inputted into the first analog-to-digital converter circuit 132a or the first analog-to-digital converter circuit 132b.

The structure of the analog circuit 131a will now be described. The readout signal line 112 branches into two lines one of which is connected to a switch RST_SMP1 and the other of which is connected to a switch SIG_SMP1. A capacitor C_RST1 (a charge storage element) is disposed between the output portion of the switch RST_SMP1 and the ground. The capacitor C_RST1 temporarily stores the voltage values of the reset electric potentials VSIG (RST) among the pixel output signals VSIG that are outputted from the pixels 120.

A switch RST_CMP10 and a switch RST_CMP11 are arranged in parallel between the output portion of the switch RST_SMP1 and the output portion of each analog circuit 131. The output portion of the switch RST_CMP10 is connected to the first analog-to-digital converter circuit 132a, and the output portion of the switch RST_CMP11 is connected to the first analog-to-digital converter circuit 132b.

Relative positions of a switch SIG_CMP10, a switch SIG_CMP11, and a capacitor C_SIG1 (a charge storage element) with respect to the switch SIG_SMP1 are the same as relative positions of the switch RST_CMP10, the switch RST_CMP11, and the capacitor C_RST1 (the charge storage element) with respect to the switch RST_SMP1. The structures of the switches and capacitors of the analog circuits 131b and 131c are the same as those of the analog circuit 131a. Signs for the switches and capacitors of the analog circuit 131b are obtained by changing respective signs for the switches and capacitors of the analog circuit 131a into 2 or numbers from 20 to 29. Signs for the switches and capacitors of the analog circuit 131c are obtained by changing respective signs for the switches and capacitors of the analog circuit 131a into 3 or numbers from 30 to 39.

Each first analog-to-digital converter circuit 132 is a typical single-slope analog-to-digital converter circuit that includes, for example, a comparator and a counter. The first analog-to-digital converter circuit 132 is connected to the comparison signal generator 133.

The first analog-to-digital converter circuit 132 compares the voltage values of the pixel output signals VSIG that are stored in the charge storage elements such as C_RST1 and a comparison signal VRAMP_H or VRAMP_L that is generated by the comparison signal generator 133 by using the comparator. The number of pulse counts counted by the counter depending on the output of the comparator is outputted as the output digital signal of the analog-to-digital converter 130. The single-slope analog-to-digital converter circuit means a circuit that performs analog-to-digital conversion in a manner in which the comparator compares an analog input signal and a comparison signal, and the number of pulse counts of a clock signal used for reversing the relationship in the magnitude thereof is outputted as a digital signal.

Structure of Reference Analog-to-Digital Converter 135

Figure 4:
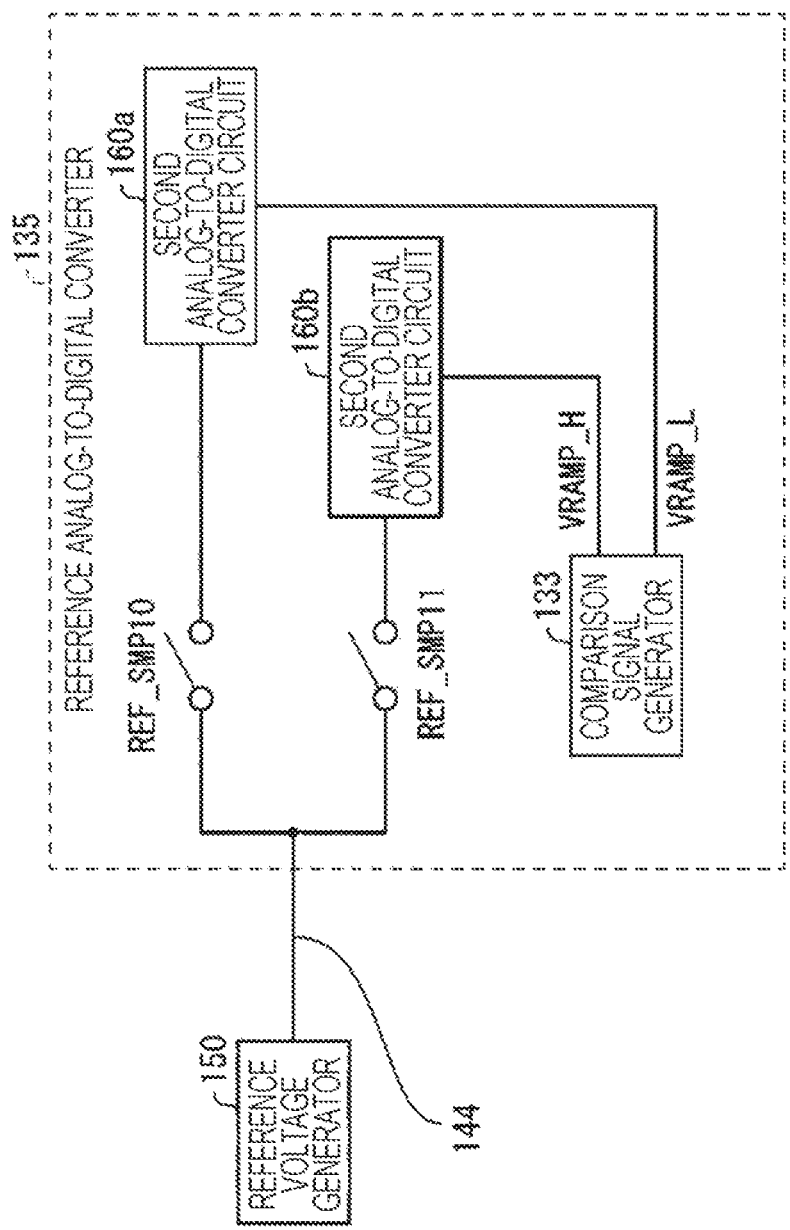
FIG. 4 is a schematic circuit diagram illustrating the structure of a reference analog-to-digital converter of the solid-state imaging device according to the first embodiment.

As illustrated in FIG. 4, a reference voltage VREF is inputted into the reference analog-to-digital converter 135. The reference voltage VREF is generated by the reference voltage generator 150 and is inputted into the reference analog-to-digital converter 135 via the reference signal line 144. The reference analog-to-digital converter 135 performs the analog-to-digital conversion of the reference voltage VREF and outputs a correction digital signal.

The reference analog-to-digital converter 135 includes second analog-to-digital converter circuits 160a and 160b and the comparison signal generator 133. In the following description, the second analog-to-digital converter circuits 160a and 160b are collectively referred to as second analog-to-digital converter circuits 160 in some cases.

Overview of Operation of Analog-to-Digital Converter 130

Figure 5:
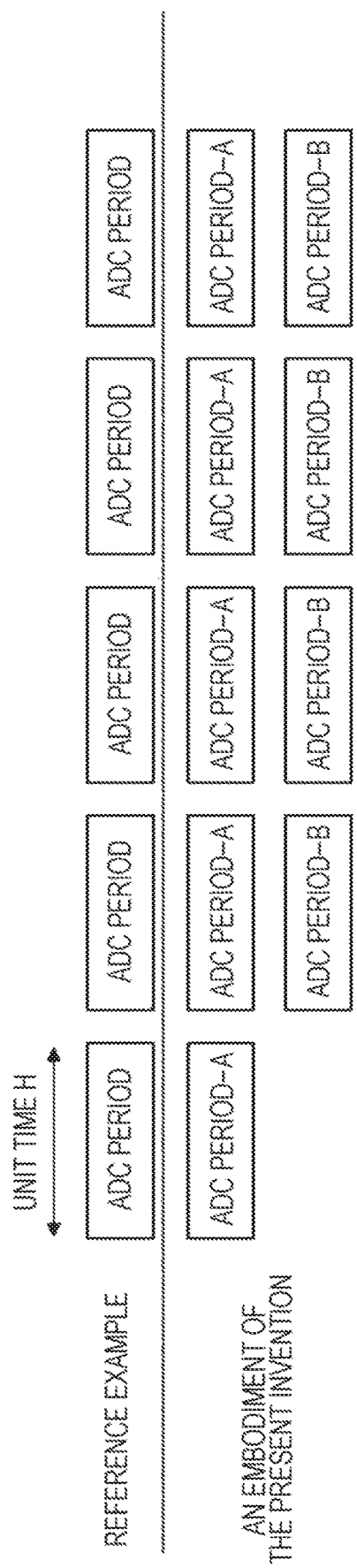
FIG. 5 schematically illustrates the operation of the analog-to-digital converter of the solid-state imaging device according to the first embodiment.

The overview of the operation of each analog-to-digital converter 130 will be described with reference to FIG. 5 and FIG. 6. FIG. 5 schematically illustrates operations of performing analog-to-digital conversion per unit time H regarding an analog-to-digital converter in a reference example and the analog-to-digital converter 130 according to the present embodiment. The unit time H means time for a single cycle during which the analog-to-digital converter 130 reads a single pixel and also means a cycle for digital output for a single pixel.

The analog-to-digital converter in the reference example sets the unit time H or an ADC period of time such that the ADC period of time during which the analog-to-digital conversion of a single pixel output signal VSIG is performed is within the unit time H.

Accordingly, a decrease in the unit time H enables the frame rate of a solid-state imaging device that includes the analog-to-digital converter in the reference example to be improved, but it is not permitted to take a long ADC period of time. For this reason, the analog-to-digital conversion bit number of the analog-to-digital converter in the reference example is limited. In the case where the ADC period of time is set to be long in order to increase the analog-to-digital conversion bit number, the frame rate of the solid-state imaging device that includes the analog-to-digital converter in the reference example decreases.

The analog-to-digital converter 130 according to the present embodiment performs the analog-to-digital conversion of a single pixel output signal VSIG by dividing the analog-to-digital conversion into two of analog-to-digital conversion during an ADC period-A and analog-to-digital conversion during an ADC period-B. The structure of each analog circuit 131 enables the analog-to-digital converter 130 to perform analog-to-digital conversion by using pipeline operation, and operations during the ADC period-A and the ADC period-B can be simultaneously performed.

ADC Period-A and ADC Period-B

A method in which the analog-to-digital converter 130 divides the ADC period into two of the ADC period-A and the ADC period-B will now be described with reference to FIG. 6. FIG. 6 illustrates waveforms that represent variation in the voltage values of the comparison signals that are generated by the comparison signal generator 133 with time.

The comparison signal generator that is included in the analog-to-digital converter in the reference example generates a comparison signal VRAMP. In an example described herein, the analog-to-digital conversion bit number is about 14 bits (the analog-to-digital conversion resolution is about 2 to the power of fourteen=16384 stages).

The ADC period is a period until the 16383-th count ends since the counter that is included in the first analog-to-digital converter circuit starts counting the number of clocks. The comparison signal VRAMP is a single-slope ramp waveform signal the voltage value of which linearly varies from the upper limit to the lower limit with time during the ADC period.

The comparison signal generator 133 that is included in each analog-to-digital converter 130 temporally divides the comparison signal VRAMP described above into the two comparison signals VRAMP_H and VRAMP_L. This will now be described in detail.

During the ADC period-A, the comparison signal generator 133 generates the comparison signal VRAMP_H. The comparison signal VRAMP_H is a signal the voltage value of which varies within the range of the voltage value of the comparison signal VRAMP described above in a period in which the number of counts counted by the counter ranges from 0 counts to 8320 counts. During a period in which the voltage value of the comparison signal VRAMP_H varies, the counter that is included in the first analog-to-digital converter circuit 132a starts counting from 0 counts and counts until 8320 counts. The ADC period-A is a period during counting.

During the ADC period-B, the comparison signal generator 133 generates the comparison signal VRAMP_L. The comparison signal VRAMP_L is a signal the voltage value of which varies within the range of the voltage value of the comparison signal VRAMP in a period in which the number of counts counted by the counter ranges from 8064 counts to 16383 counts. During a period in which the voltage value of the comparison signal VRAMP_L varies, the counter that is included in the first analog-to-digital converter circuit 132b starts counting from 8064 counts and counts until 16383 counts. The ADC period-B is a period during counting.

As for the comparison signals VRAMP_H and VRAMP_L that are thus generated by the comparison signal generator 133, a single-slope ramp waveform is obtained by connecting the waveforms thereof. In other words, the comparison signal generator 133 generates the comparison signals VRAMP_H and VRAMP_L such that a waveform having a voltage value that ranges from the upper limit to the lower limit of the comparison signal VRAMP and that has linearity and continuity between the upper limit and the lower limit is formed by connecting the waveforms that represent variation in the voltage values of the comparison signals VRAMP_H and VRAMP_L with time to each other.

Furthermore, the comparison signals VRAMP_H and VRAMP_L are single-slope ramp waveform signals the voltage values of which vary within a certain range between the upper limit and the lower limit of all of the comparison signals that are generated by the comparison signal generator 133 with time. The number of the comparison signals that are generated by the comparison signal generator 133 is not limited to 2 but may be three or more. Also, in this case, a single-slope ramp waveform is obtained by connecting the waveforms of three or more comparison signals that are generated by the comparison signal generator 133.

The case where the waveform of the comparison signal VRAMP_H or VRAMP_L has the "linearity and continuity" includes the case where the voltage value is disordered or interrupted for a time due to power supply environment or influence of a permissible noise. That is, even in the case where a part of the waveform of the comparison signal is not linear due to influence of, for example, a noise as described above, the waveform of the comparison signal has the "linearity and continuity".

Effect of Division of ADC Period

The number of pulse counts counted by the counter during the ADC period-A and the ADC period-B is substantially the half of that during the ADC period of the analog-to-digital converter in the reference example as described above, and the ADC period-A of time and the ADC period-B of time are substantially the half thereof. The analog-to-digital converter 130 can simultaneously perform the operations during the ADC period-A and the ADC period-B by using the pipeline operation. Accordingly, the analog-to-digital converter 130 can perform analog-to-digital conversion with the same analog-to-digital conversion bit number as in the analog-to-digital converter in the reference example during substantially half of time in the case of the analog-to-digital converter in the reference example.

The analog-to-digital converter 130 can ensure substantially twice the analog-to-digital conversion bit number of the analog-to-digital converter in the reference example as described above, provided that the unit time H is the same. The analog-to-digital converter 130 enables the unit time H to be substantially halved and consequently enables the frame rate to be substantially doubled, provided that the analog-to-digital conversion bit number is the same as that in the analog-to-digital converter in the reference example.

Reference Voltage

As illustrated in FIG. 6, the reference voltage generator 150 generates the reference voltage VREF having a voltage value of both of the comparison signals VRAMP_H and VRAMP_L. In the reference analog-to-digital converter 135, the reference voltage VREF is inputted into the second analog-to-digital converter circuit 160a during the ADC period-A, and the reference voltage VREF is inputted into the second analog-to-digital converter circuit 160b during the ADC period-B. The second analog-to-digital converter circuits 160a and 160b compare the reference voltage VREF with the comparison signal VRAMP_H or VRAMP_L. At this time, the same voltage value is inputted into the second analog-to-digital converter circuits 160a and 160b, and the values of the correction digital signals that are outputted by the second analog-to-digital converter circuits 160a and 160b are supposed to be the same.

However, for a reason of power supply environment, a noise in the solid-state imaging device 1, or another reason, the value of the correction digital signal that is outputted from the reference analog-to-digital converter 135 during the ADC period-A and that during the ADC period-B differ from each other in some cases. In these cases, it can be thought that differences are made also in each analog-to-digital converter 130 that simultaneously operates, and the linearity of the result of analog-to-digital conversion that is performed by the analog-to-digital converter 130 during the ADC period-A and the ADC period-B is impaired.

To correct this, the corrector 170 obtains the difference between the values of the correction digital signals in the case where the values of the correction digital signals that are outputted from the second analog-to-digital converter circuits 160a and 160b differ from each other. The corrector 170 corrects the values of the digital signals that are outputted from the first analog-to-digital converter circuits 132a and 132b of the analog-to-digital converter 130 by using the difference. The function of the corrector 170 may be performed by, for example, a CPU (not illustrated) that is included in the solid-state imaging device 1.

Effect of Reference Voltage

The comparison signals VRAMP_H and VRAMP_L thus have voltage values that partly overlap, and the reference voltage VREF has an overlapping voltage value. This enables the linearity of the result of analog-to-digital conversion during the ADC period-A and the ADC period-B to be ensured by correction. Accordingly, even when the analog-to-digital conversion is divided into analog-to-digital conversion during the ADC period-A and analog-to-digital conversion during the ADC period-B by using the pipeline operation, the output of the result of the analog-to-digital conversion is accurately obtained.

Specific Operation of Analog-to-Digital Converter 130

Figure 7A:
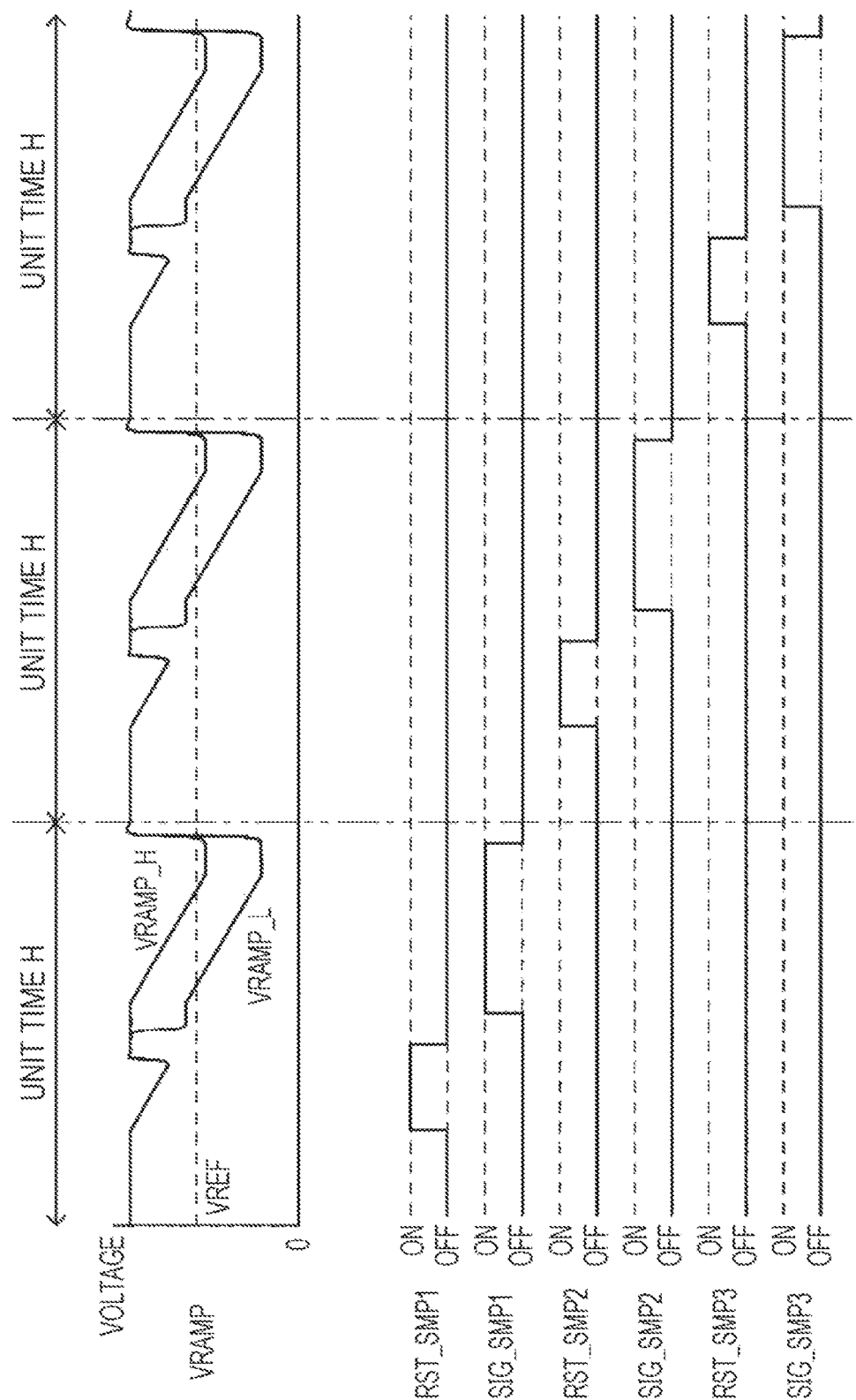
FIG. 7A and FIG. 7B illustrate a timing chart illustrating the operation of the analog-to-digital converter of the solid-state imaging device according to the first embodiment.
Figure 7B:
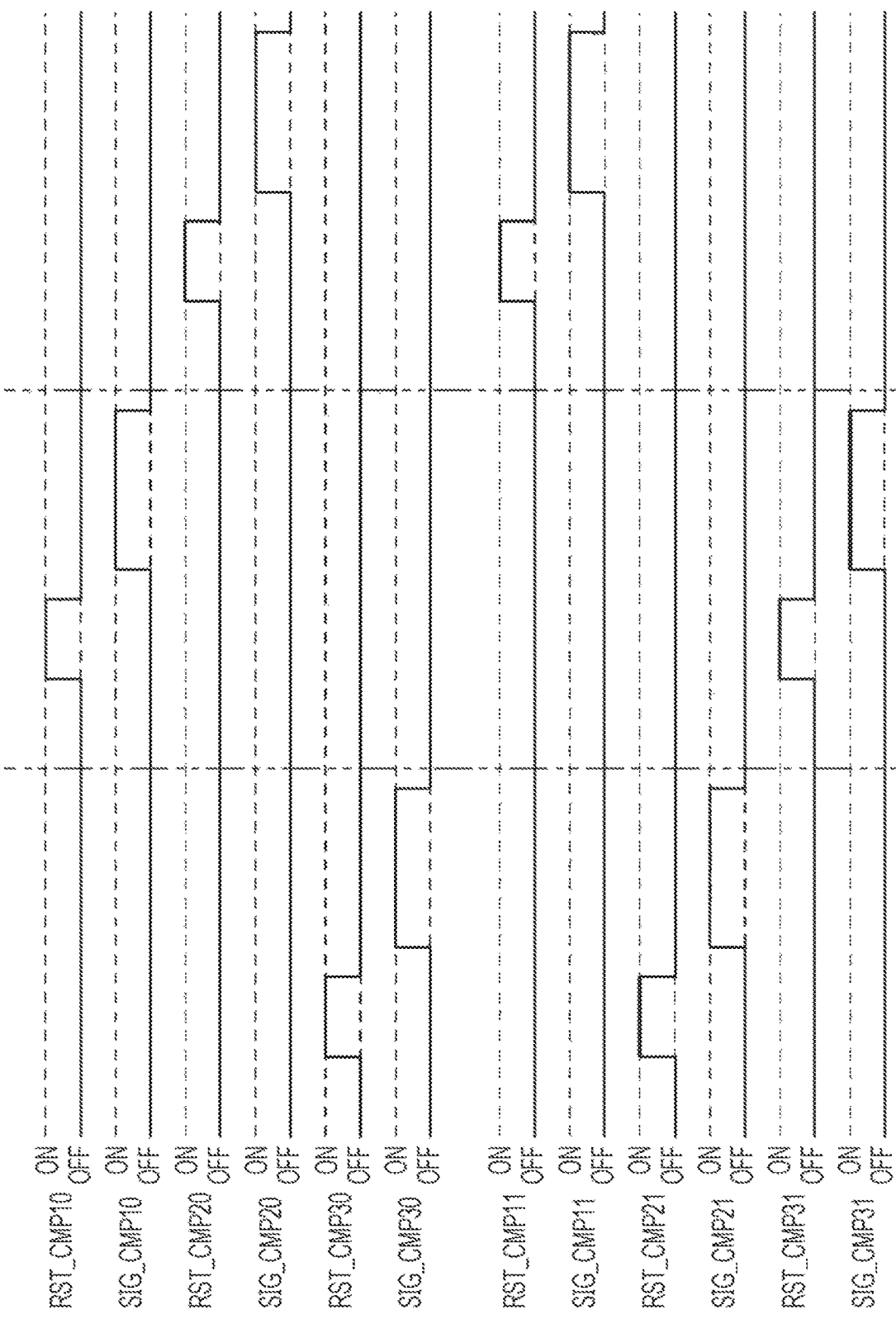

FIG. 7A and FIG. 7B illustrate a timing chart illustrating, for example, the on-off operation of the switches of each analog-to-digital converter 130. The operation of the analog-to-digital converter 130 will be described with reference to this. The analog-to-digital converter 130 sequentially performs an operation of reading sets of the reset electric potentials and the signal electric potentials of the pixels 120 that are sequentially transmitted as the pixel output signals VSIG by using the three analog circuits 131a, 131b, and 131c. In the analog-to-digital converter 130, the reset electric potentials and the signal electric potentials of the pixels 120 that are stored in the three analog circuits 131a, 131b, and 131c are inputted into the analog-to-digital converter circuits 132 to perform an analog-to-digital conversion process. A readout process and the analog-to-digital conversion process are simultaneously processed.

During the first one unit time H, the analog circuit 131a performs the readout process for one of the pixels 120 in the k-th row. During the subsequent two unit times H, the analog circuit 131a performs the analog-to-digital conversion process by using the first analog-to-digital converter circuit 132a or the first analog-to-digital converter circuit 132b.

During the first one unit time H, the analog circuit 131b performs the analog-to-digital conversion process for one of the pixels 120 in the (k−2)-th row by using the first analog-to-digital converter circuit 132b. During the subsequent one unit time H, the readout process for one of the pixels 120 in the (k+1)-th row is performed. During the subsequent one unit time H, the analog-to-digital conversion process for the pixel 120 in the (k+1)-th row is performed by the first analog-to-digital converter circuit 132a.

During the first one unit time H, the analog circuit 131c performs the analog-to-digital conversion process for one of the pixels 120 in the (k−1)-th row by using the first analog-to-digital converter circuit 132a. During the subsequent one unit time H, the analog-to-digital conversion process for one of the pixels 120 in the (k−1)-th row is performed by the first analog-to-digital converter circuit 132b. During the subsequent one unit time H, the readout process for one of the pixels 120 in the (k+2)-th row is performed.

The cycle of the on-off operation of the switches is three unit times H. A process for a single pixel (the k-th row) that is performed during three unit times H will be described below, and the on-off operation of the switches that are included in the analog circuit 131a will be described below. The on-off operation of the switches that are included in the analog circuits 131b and 131c starts with timing that differs from that in the case of the analog circuit 131a by one unit time H or two unit times H and is performed in the same manner as that of the switches that are included in the analog circuit 131a, and a detailed description thereof is omitted.

Sampling Period of Electric Potential

During the first unit time H, the reset electric potential and the signal electric potential of the pixel 120 in the k-th row are sampled. At first, all of the switches are off. The switch RST_SMP1 is turned on to sample the reset electric potential and is turned off at the end of the sampling period for the reset electric potential. The reset electric potential VSIG (RST) and the ground electric potential are then applied across both ends of the capacitor C_RST1. Accordingly, the difference between the electric potentials of both ends of the capacitor C_RST1 is VSIG (RST). Subsequently, the switch SIG_SMP1 is turned on to sample the signal electric potential and is turned off at the end of the sampling period for the signal electric potential. The reset electric potential VSIG (SIG) and the ground electric potential are then applied across both ends of the capacitor C_SIG1. Accordingly, the difference between the electric potentials of both ends of the capacitor C_SIG1 is VSIG (SIG).

Analog-to-Digital Conversion Period

During the subsequent two unit times H, the analog-to-digital conversion of the reset electric potential and the signal electric potential of the pixel 120 in the k-th row is performed. The analog-to-digital converter 130 performs analog-to-digital conversion by using the first analog-to-digital converter circuit 132a during the first one unit time H of the two unit times H and performs analog-to-digital conversion by using the first analog-to-digital converter circuit 132b during the subsequent one unit time H.

Analog-to-Digital Conversion Performed by First Analog-to-Digital Converter Circuit 132a The analog-to-digital conversion that is performed by the first analog-to-digital converter circuit 132a will be described. The analog circuit 131a first turns on the switch RST_CMP10. Consequently, the reset electric potential VSIG (RST) that is stored in the capacitor C_RST1 is inputted into the first analog-to-digital converter circuit 132a. The first analog-to-digital converter circuit 132a starts single-slope analog-to-digital conversion. The comparison signal generator 133 starts generating the comparison signal VRAMP_H. The counter that is included in the first analog-to-digital converter circuit 132a starts counting down. When the output of the comparator that is included in the first analog-to-digital converter circuit 132a is reversed, the counter described above stops counting. In this way, the analog-to-digital conversion of the reset electric potential VSIG (RST) is performed.

The analog circuit 131a turns off the switch RST_CMP10 after counting is stopped. Subsequently, the analog circuit 131a turns on the switch SIG_CMP10. The signal electric potential VSIG (SIG) of the pixel 120 in the k-th row that is stored in the capacitor C_SIG1 is inputted into the first analog-to-digital converter circuit 132a.

The first analog-to-digital converter circuit 132a starts single-slope analog-to-digital conversion. The comparison signal generator 133 starts generating the comparison signal VRAMP_H, and the counter described above starts counting up. When the output of the comparator described above is reversed, the counter described above stops counting. In this way, the analog-to-digital conversion of the signal electric potential VSIG (SIG) is performed. The analog circuit 131a turns off the switch SIG_CMP10 after counting is stopped.

In the analog-to-digital conversion of the signal electric potential VSIG (SIG), the first analog-to-digital converter circuit 132a successively uses the number of counts at the end of counting down for the reset electric potential VSIG (RST) to count up. In the case where the first analog-to-digital converter circuit 132a successfully performs the analog-to-digital conversion of the signal electric potential VSIG (SIG), the number of counts corresponds to the difference between the value of the analog-to-digital conversion of the reset electric potential VSIG (RST) and the value of the analog-to-digital conversion of the signal electric potential VSIG (SIG). That is, VSIG (RST)−VSIG (SIG) corresponds to the final number of counts and is outputted as the digital signal of the result of the analog-to-digital conversion from the analog-to-digital converter 130.

In the case where the voltage value of the signal electric potential VSIG (SIG) is not in the range of the voltage value of the comparison signal VRAMP_H, the analog-to-digital converter 130 outputs, for example, the allowed maximum value of VSIG (RST)−VSIG (SIG).

Analog-to-Digital Conversion Performed by First Analog-to-Digital Converter Circuit 132b The analog-to-digital conversion that is performed by the first analog-to-digital converter circuit 132b will now be described. The analog circuit 131a first turns on the switch RST_CMP11. Consequently, the reset electric potential VSIG (RST) that is stored in the capacitor C_RST1 is inputted into the first analog-to-digital converter circuit 132b. The first analog-to-digital converter circuit 132b starts single-slope analog-to-digital conversion. The comparison signal generator 133 starts generating the comparison signal VRAMP_L. The counter that is included in the first analog-to-digital converter circuit 132b starts counting down.

At this time, the number of counts when the counter starts counting is set depending on the voltage value when ramping of the comparison signal VRAMP_L starts. Accordingly, the result of the analog-to-digital conversion that is performed by the first analog-to-digital converter circuit 132a and the result of the analog-to-digital conversion that is performed by the first analog-to-digital converter circuit 132b are proportional to the inputted voltage value, and an output result with linearity is obtained.

When the output of the comparator that is included in the first analog-to-digital converter circuit 132b is reversed, the counter described above stops counting. In this way, the analog-to-digital conversion of the reset electric potential VSIG (RST) is performed.

The analog circuit 131a turns off the switch RST_CMP11 after counting is stopped. Subsequently, the analog circuit 131a turns on the switch SIG_CMP11. The signal electric potential VSIG (SIG) of the pixel 120 in the k-th row that is stored in the capacitor C_SIG1 is inputted into the first analog-to-digital converter circuit 132b.

The first analog-to-digital converter circuit 132b starts single-slope analog-to-digital conversion. The comparison signal generator 133 starts generating the comparison signal VRAMP_L, and the counter described above starts counting up. When the output of the comparator described above is reversed, the counter described above stops counting. In this way, the analog-to-digital conversion of the signal electric potential VSIG (SIG) is performed. The analog circuit 131a turns off the switch SIG_CMP11 after counting is stopped.

In the analog-to-digital conversion of the signal electric potential VSIG (SIG), the first analog-to-digital converter circuit 132b successively uses the number of counts at the end of counting down for the reset electric potential VSIG (RST) to count up. In the case where the first analog-to-digital converter circuit 132b successfully performs the analog-to-digital conversion of the signal electric potential VSIG (SIG), the number of counts corresponds to the difference between the value of the analog-to-digital conversion of the reset electric potential VSIG (RST) and the value of the analog-to-digital conversion of the signal electric potential VSIG (SIG). That is, VSIG (RST)−VSIG (SIG) corresponds to the final number of counts and is outputted as a digital signal from the analog-to-digital converter 130.

In the case where the voltage value of the signal electric potential VSIG (SIG) is not in the range of the voltage value of the comparison signal VRAMP_L, the analog-to-digital converter 130 outputs, for example, the allowed maximum value of VSIG (RST)−VSIG (SIG).

There is a possibility that the voltage value of the signal electric potential VSIG (SIG) is not in the ranges of the voltages of the comparison signals VRAMP_H and VRAMP_L. At this time, the analog-to-digital converter 130 outputs the result of analog-to-digital conversion by using the comparison signals VRAMP_H and VRAMP_L as the "allowed maximum value of VSIG (RST)−VSIG (SIG)". Since such an output does not typically occur, the solid-state imaging device 1 can determine from the output that the voltage value of the signal electric potential VSIG (SIG) is not in the ranges of the voltages of the comparison signals described above.

Operation of Reference Analog-to-Digital Converter 135

The reference analog-to-digital converter 135 turns on a switch REF_SMP10 when the comparison signal VRAMP_H is generated by the comparison signal generator 133 and turns on a switch REF_SMP11 when the comparison signal VRAMP_L is generated, per unit time H.

Consequently, the reference voltage VREF is inputted into each second analog-to-digital converter circuit 160. The second analog-to-digital converter circuit 160 starts single-slope analog-to-digital conversion. The comparison signal generator 133 starts generating the comparison signal VRAMP_H and the comparison signal VRAMP_L. A counter that is included in the second analog-to-digital converter circuit 160 starts counting down. When the output of a comparator that is included in the second analog-to-digital converter circuit 160 is reversed, the counter described above stops counting. In this way, the analog-to-digital conversion of the reference voltage VREF is performed, and the result is outputted as the correction digital signal from the reference analog-to-digital converter 135.

The reference analog-to-digital converter 135 turns off the switches REF_SMP10 and REF_SMP11 after counting is stopped.

In this case, the corrector 170 corrects the result of analog-to-digital conversion by using the output of the analog-to-digital converter 130 and the output of the reference analog-to-digital converter 135 during the ADC period-A and the ADC period-B. However, a method of correcting the result of the analog-to-digital conversion that is performed by the analog-to-digital converter 130 by using the reference voltage VREF is not limited thereto. For example, VSIG (SIG) during the ADC period-A and VSIG (SIG) during the ADC period-B may be corrected and combined by using the reference voltage VREF to obtain VSIG (RST) −VSIG (SIG). In this case, the value of VSIG (RST)−VSIG (SIG) may be obtained by, for example, the corrector 170.

Second Embodiment

A solid-state imaging device 2 according to the present embodiment differs from the solid-state imaging device 1 according to the first embodiment in including analog-to-digital converters 230 each of which includes analog circuits 231 that have circuit structures that differ from those of the analog circuits 131.

The solid-state imaging device 1 includes the analog circuits 131 that have the circuit structures on the assumption that, for example, when the voltage values are read from the capacitors that are included in the analog circuits 131, the voltage values that are stored in the capacitors are not affected. However, the solid-state imaging device 2 according to the present embodiment includes the analog circuits 231 that have circuit structures on the assumption that the voltage values that are stored in capacitors that are included in the analog circuits 231 change due to influence of, for example, readout. In other aspect, the solid-state imaging device 2 has the same structure as that of the solid-state imaging device 1 according to the first embodiment.

Structure of Analog-to-Digital Converter 230

Figure 8:
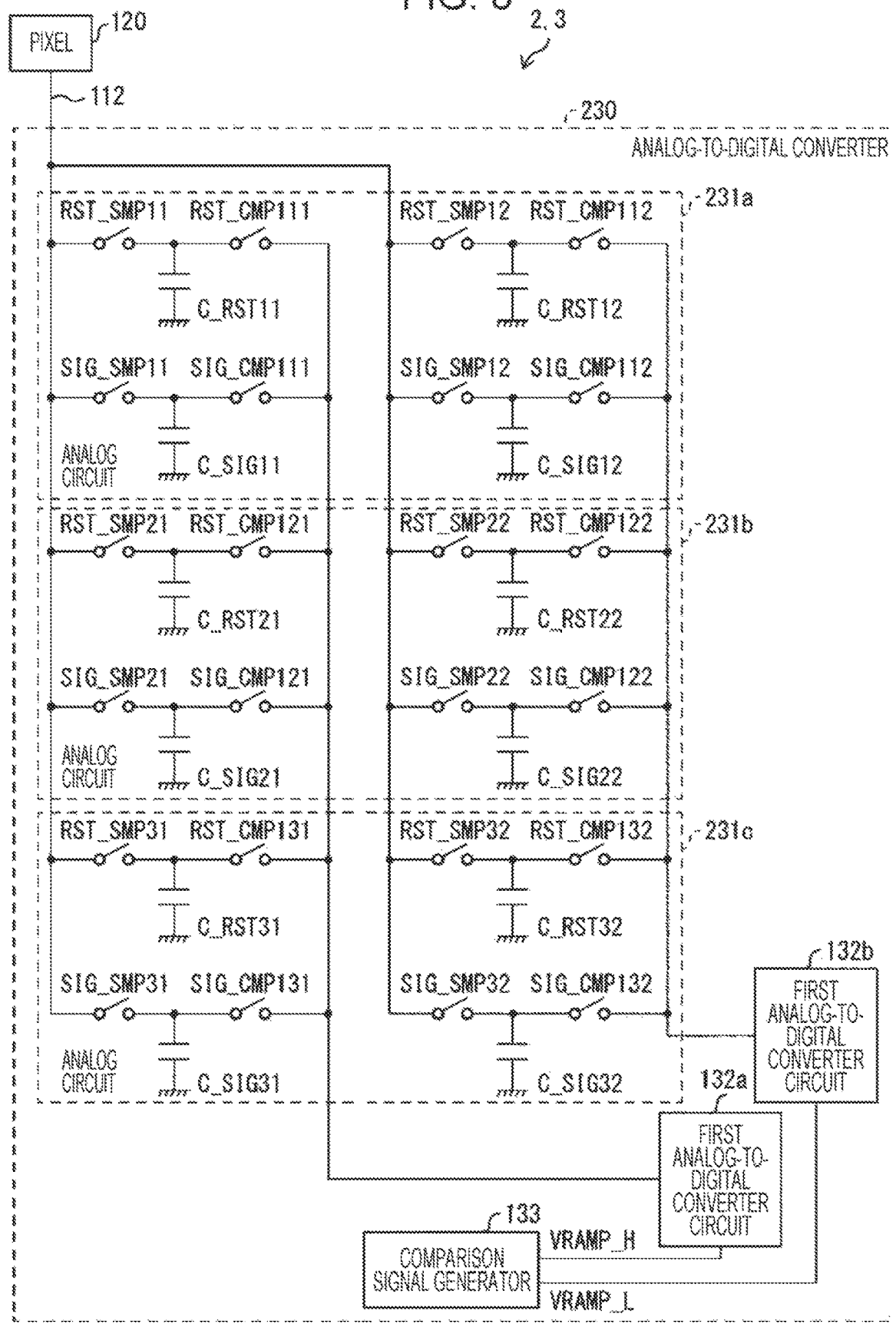
FIG. 8 is a schematic circuit diagram illustrating the structure of an analog-to-digital converter of a solid-state imaging device according to a second embodiment.

As illustrated in FIG. 8, the pixel output signals VSIG are inputted into each analog-to-digital converter 230. The pixel output signals VSIG are the outputs of the pixels 120 in a row that is selected by the vertical scanning circuit 110. The analog-to-digital converter 230 reads (samples) the reset electric potentials VSIG (RST) and the signal electric potentials VSIG (SIG) that are generated by the pixels 120 and converts VSIG (RST) and VSIG (SIG) into digital signals. The analog-to-digital converter 230 performs correlated double sampling (CDS) operation in which the difference between the digital signals is obtained and outputs the difference that is obtained by performing the sampling operation as the digital signal of the result of the analog-to-digital conversion. In the correlated double sampling, the difference between the digital signals may not be obtained, but the difference between the analog signals may be obtained as described above.

The analog-to-digital converter 230 includes analog circuits 231*a*, 231*b*, and 231*c*, the first analog-to-digital converter circuits 132*a* and 132*b*, and the comparison signal generator 133. In the following description, a portion of the analog-to-digital converter 230 near an input terminal is referred to as an input portion, and a portion thereof near a digital output terminal is referred to as an output portion. The analog circuits 231*a*, 231*b*, and 231*c* are collectively referred to as the analog circuits 231 in some cases.

The analog circuits 231 include the three analog circuits 231*a*, 231*b*, and 231*c* that are connected to each other in parallel. The three analog circuits 231*a*, 231*b*, and 231*c* have the same structure. In the analog-to-digital converter 230, the input terminal into which the pixel output signals VSIG are inputted branches and is connected to the analog circuits 231*a*, 231*b*, and 231*c*. The outputs of the analog circuits 231*a*, 231*b*, and 231*c* merge and are inputted into the first analog-to-digital converter circuit 132*a* or the first analog-to-digital converter circuit 132*b*.

The structure of the analog circuits 231*a* will now be described. The analog circuits 231*a* includes two analog circuits that have the same circuit structure and that are arranged in parallel. The readout signal line 112 branches into two lines one of which is connected to switches RST_SMP11 and SIG_SMP11 and the other of which is connected to switches RST_SMP12 and SIG_SMP12.

A capacitor C_RST11 (a charge storage element) is disposed between the output portion of the switch RST_SMP11 and the ground. The capacitor C_RST11 temporarily stores the voltage values of the reset electric potentials VSIG (RST) among the pixel output signals VSIG that are outputted from the pixels 120. The same is true for the switch RST_SMP12 and a capacitor C_RST12 (a charge storage element).

A switch RST_CMP111 is disposed between the output portion of the switch RST_SMP11 and the output portion of each analog circuit 231. The output portion of the switch RST_CMP111 is connected to the first analog-to-digital converter circuit 132*a*. A switch RST_CMP112 is disposed between the output portion of the switch RST_SMP12 and the output portion of each analog circuit 231. The output portion of the switch RST_CMP112 is connected to the first analog-to-digital converter circuit 132*b*.

Relative positions of a switch SIG_CMP111 and a capacitor C_SIG11 with respect to the switch SIG_SMP11 are the same as relative positions of the switch RST_CMP111 and the capacitor C_RST11 with respect to the switch RST_SMP11. Relative positions of a switch SIG_CMP112 and a capacitor C_SIG12 with respect to the switch SIG_SMP12 are the same as relative positions of the switch RST_CMP112 and the capacitor C_RST12 with respect to the switch RST_SMP12.

The structures of the switches and capacitors of the analog circuits 231*b* and 231*c* are the same as those of the analog circuit 231*a*. Signs for the switches and capacitors of the analog circuit 231*b* are obtained by changing respective signs for the switches and capacitors of the analog circuit 231*a* into numbers from 20 to 29 or numbers from 120 to 129. Signs for the switches and capacitors of the analog circuit 231*c* are obtained by changing respective signs for the switches and capacitors of the analog circuit 231*a* into numbers from 30 to 39 or numbers from 130 to 139.

The first analog-to-digital converter circuits 132 and the comparison signal generator 133 are the same as those of the analog-to-digital converters 130 according to the first embodiment, and a description thereof is omitted.

Specific Operation of Analog-to-Digital Converter 230

Figure 9A:
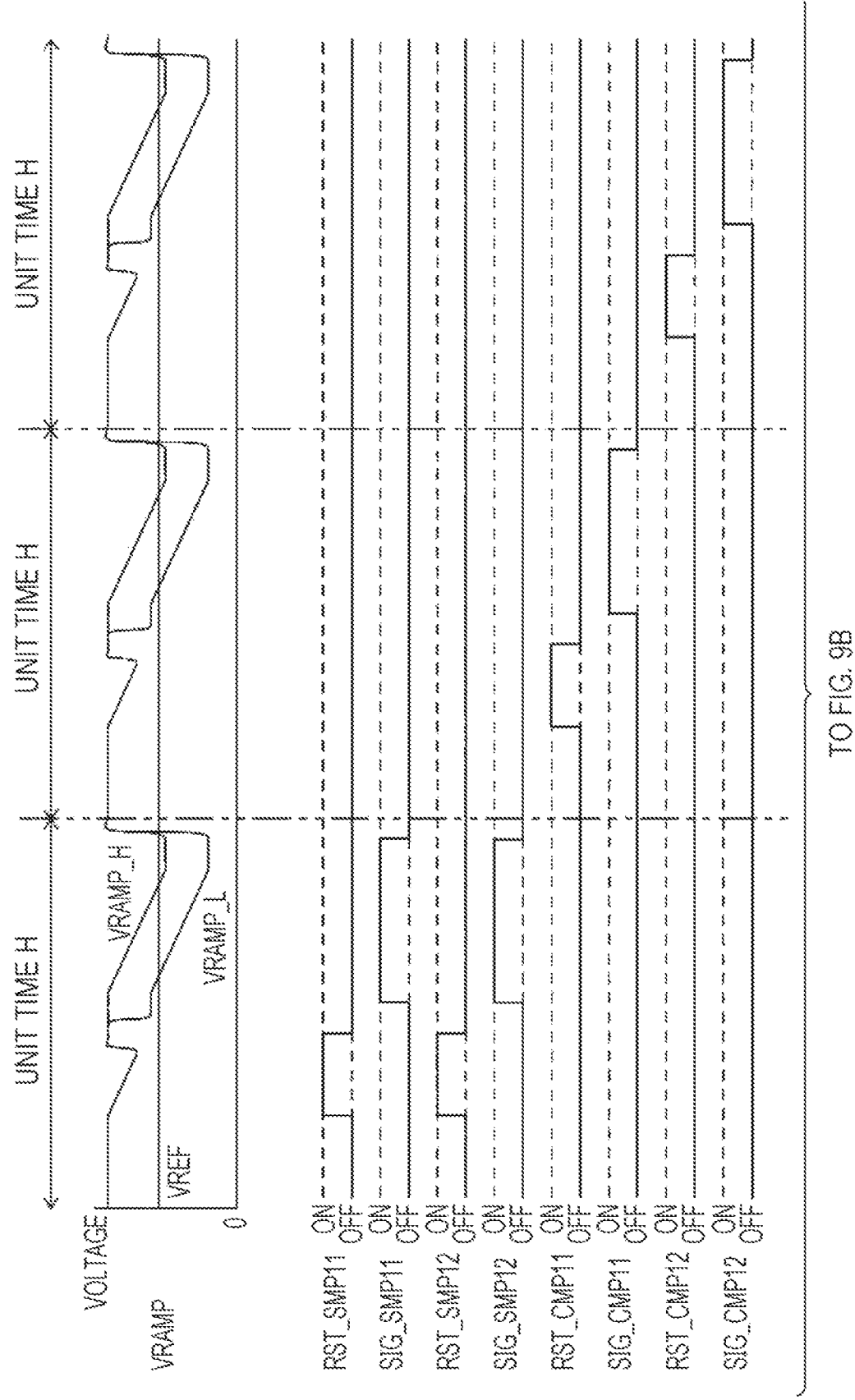

FIG. 9A and FIG. 9B illustrate a timing chart illustrating, for example, the on-off operation of the switches of each analog-to-digital converter 230. The operation of the analog-to-digital converter 230 will be described with reference to this.

The analog-to-digital converter 230 sequentially performs the operation of reading sets of the reset electric potentials and the signal electric potentials that are sequentially transmitted as the pixel output signals VSIG from the pixels 120 by using the three analog circuits 231*a*, 231*b*, and 231*c*. In the analog-to-digital converter 230, the reset electric potentials and the signal electric potentials of the pixels 120 that are stored in the three analog circuits 231*a*, 231*b*, and 231*c* are inputted into the analog-to-digital converter circuits 132 to perform the analog-to-digital conversion process. The readout process and the analog-to-digital conversion process are simultaneously processed.

During the first one unit time H, the analog circuit 231*a* performs the readout process for one of the pixels 120 in the k-th row. During the subsequent two unit times H, the analog circuit 231*a* performs the analog-to-digital conversion process by using the first analog-to-digital converter circuit 132*a* or the first analog-to-digital converter circuit 132*b*.

During the first one unit time H, the analog circuit 231*b* performs the analog-to-digital conversion process for one of the pixels 120 in the (k−2)-th row by using the first analog-to-digital converter circuit 132*b*. During the subsequent one unit time H, the readout process for one of the pixels 120 in the (k+1)-th row is performed. During the subsequent one unit time H, the analog-to-digital conversion process for the pixel 120 in the (k+1)-th row is performed by the first analog-to-digital converter circuit 132*a*.

During the first one unit time H, the analog circuit 231*c* performs the analog-to-digital conversion process for one of the pixels 120 in the (k−1)-th row by using the first analog-to-digital converter circuit 132*a*. During the subsequent one unit time H, the analog-to-digital conversion process for one of the pixels 120 in the (k−1)-th row is performed by the first analog-to-digital converter circuit 132*b*. During the subsequent one unit time H, the readout process for one of the pixels 120 in the (k+2)-th row is performed.

The cycle of the on-off operation of the switches is three unit times H. A process for a single pixel (the k-th row) that is performed during three unit times H will be described below, and the on-off operation of the switches that are included in the analog circuit 231*a* will be described below. The on-off operation of the switches that are included in the analog circuits 231*b* and 231*c* starts with timing that differs from that in the case of the analog circuit 231*a* by one unit time H or two unit times H and is performed in the same manner as that of the switches that are included in the analog circuit 231*a*, and a detailed description thereof is omitted.

Sampling Period of Electric Potential

During the first unit time H, the reset electric potential and the signal electric potential of the pixel 120 in the k-th row are sampled. At first, all of the switches are off. The switch RST_SMP11 and the switch RST_SMP12 are turned on to sample the reset electric potential and are turned off at the end of the sampling period for the reset electric potential. The reset electric potential VSIG (RST) and the ground electric potential are then applied across both ends of the capacitors C_RST11 and C_RST12. At this time, the difference between the electric potentials of both ends of the capacitor C_RST11 and C_RST12 is VSIG (RST).

Subsequently, the switch SIG_SMP11 and the switch SIG_SMP12 are turned on to sample the signal electric potential and are turned off at the end of the sampling period for the signal electric potential. The reset electric potential VSIG (SIG) and the ground electric potential are then applied across both ends of the capacitors C_SIG11 and C_SIG12. At this time, the difference between the electric potentials of both ends of each of the capacitors C_SIG11 and C_SIG12 is VSIG (SIG).

Analog-to-Digital Conversion Period for Electric Potential

During the subsequent two unit times H, the analog-to-digital conversion of the reset electric potential and the signal electric potential of the pixel 120 in the k-th row is performed. The analog-to-digital converter 230 performs analog-to-digital conversion by using the first analog-to-digital converter circuit 132*a* during the first one unit time H of the two unit times H and performs analog-to-digital conversion by using the first analog-to-digital converter circuit 132*b* during the subsequent one unit time H.

Analog-to-Digital Conversion Performed by First Analog-to-Digital Converter Circuit 132*a*

The analog-to-digital conversion that is performed by the first analog-to-digital converter circuit 132*a* will be described. The analog circuit 231*a* first turns on the switch RST_CMP111. Consequently, the reset electric potential VSIG (RST) that is stored in the capacitor C_RST11 is inputted into the first analog-to-digital converter circuit 132*a*. The first analog-to-digital converter circuit 132*a* starts single-slope analog-to-digital conversion. The analog-to-digital conversion that is performed by the first analog-to-digital converter circuit 132*a* is described in detail according to the first embodiment, and a description thereof is omitted.

The analog circuit 231*a* turns off the switch RST_CMP111 after the counter that is included in the first analog-to-digital converter circuit 132*a* stops counting. Subsequently, the analog circuit 231*a* turns on the switch SIG_CMP111. The signal electric potential VSIG (SIG) of the pixel 120 in the k-th row that is stored in the capacitor C_SIG11 is inputted into the first analog-to-digital converter circuit 132*a*. The first analog-to-digital converter circuit 132*a* starts single-slope analog-to-digital conversion. The analog circuit 231*a* turns off the switch SIG_CMP111 after counting is stopped.

The value of VSIG (RST)–VSIG (SIG) is outputted as the digital signal of the result of the analog-to-digital conversion from the analog-to-digital converter 230. In the case where the voltage value of the signal electric potential VSIG (SIG) is not in the range of the voltage value of the comparison signal VRAMP_H, the analog-to-digital converter 230 outputs, for example, the allowed maximum value of VSIG (RST)–VSIG (SIG).

Analog-to-Digital Conversion Performed by First Analog-to-Digital Converter Circuit 132*b*

The analog-to-digital conversion that is performed by the first analog-to-digital converter circuit 132*b* will be described. The analog circuit 231*a* first turns on the switch RST_CMP112. Consequently, the reset electric potential VSIG (RST) that is stored in the capacitor C_RST12 is inputted into the first analog-to-digital converter circuit 132*b*. The first analog-to-digital converter circuit 132*b* starts single-slope analog-to-digital conversion. The analog-to-digital conversion that is performed by the first analog-to-digital converter circuit 132*b* is described in detail according to the first embodiment, and a description thereof is omitted.

The analog circuit 231*a* turns off the switch RST_CMP112 after the counter that is included in the first analog-to-digital converter circuit 132*b* stops counting. Subsequently, the analog circuit 231*a* turns on the switch SIG_CMP112. The signal electric potential VSIG (SIG) of the pixel 120 in the k-th row that is stored in the capacitor C_SIG12 is inputted into the first analog-to-digital converter circuit 132*b*. The first analog-to-digital converter circuit 132*b* starts single-slope analog-to-digital conversion. The analog circuit 231*a* turns off the switch SIG_CMP112 after counting is stopped. The value of VSIG (RST)–VSIG (SIG) is outputted as a digital signal from the analog-to-digital converter 230. In the case where the voltage value of the signal electric potential VSIG (SIG) is not in the range of the voltage value of the comparison signal VRAMP_L, the analog-to-digital converter 230 outputs, for example, the allowed maximum value of VSIG (RST)–VSIG (SIG).

Effects of Analog-to-Digital Converter 230

In the analog-to-digital converter 230, the first analog-to-digital converter circuits 132*a* and 132*b* include the respective capacitors that store the electric potentials of the pixel output signals VSIG that are simultaneously inputted. For example, it is assumed that the voltage value that is stored in the capacitor C_RST11 accordingly changes when the first analog-to-digital converter circuit 132*a* reads the voltage value of the pixel output signal VSIG from the capacitor C_RST11. Also, in this case, the first analog-to-digital converter circuit 132*b* reads the voltage value of the same pixel output signal VSIG from the capacitor C_RST12 that differs therefrom, and the analog-to-digital converter 230 consequently enables analog-to-digital conversion to be simultaneously performed without problems.

Third Embodiment

A solid-state imaging device 3 according to the present embodiment differs from the solid-state imaging device 2 according to the second embodiment in that the switches of the analog circuits 231 are switched with different timing. The circuit structure of each analog-to-digital converter 230 that is included in the solid-state imaging device 3, for example, is the same as that of the solid-state imaging device 2, and a description thereof is omitted herein.

During one unit time H, the first analog-to-digital converter circuits 132 that are included in the solid-state imaging device 3 simultaneously compare the voltage value of the same pixel output signal VSIG and the comparison signals VRAMP_H and VRAMP_L. Accordingly, the solid-state imaging device 3 can perform the analog-to-digital conversion of a single pixel output signal VSIG during one unit time H.

In other words, the first analog-to-digital converter circuits 132 that are included in the solid-state imaging device 3 simultaneously compare a voltage value that is relevant to the single pixel output signal VSIG and that is stored in each capacitor included in the analog circuits 231 and the comparison signals VRAMP_H and VRAMP_L.

Specific Operation of Analog-to-Digital Converter 230

Figure 10A:
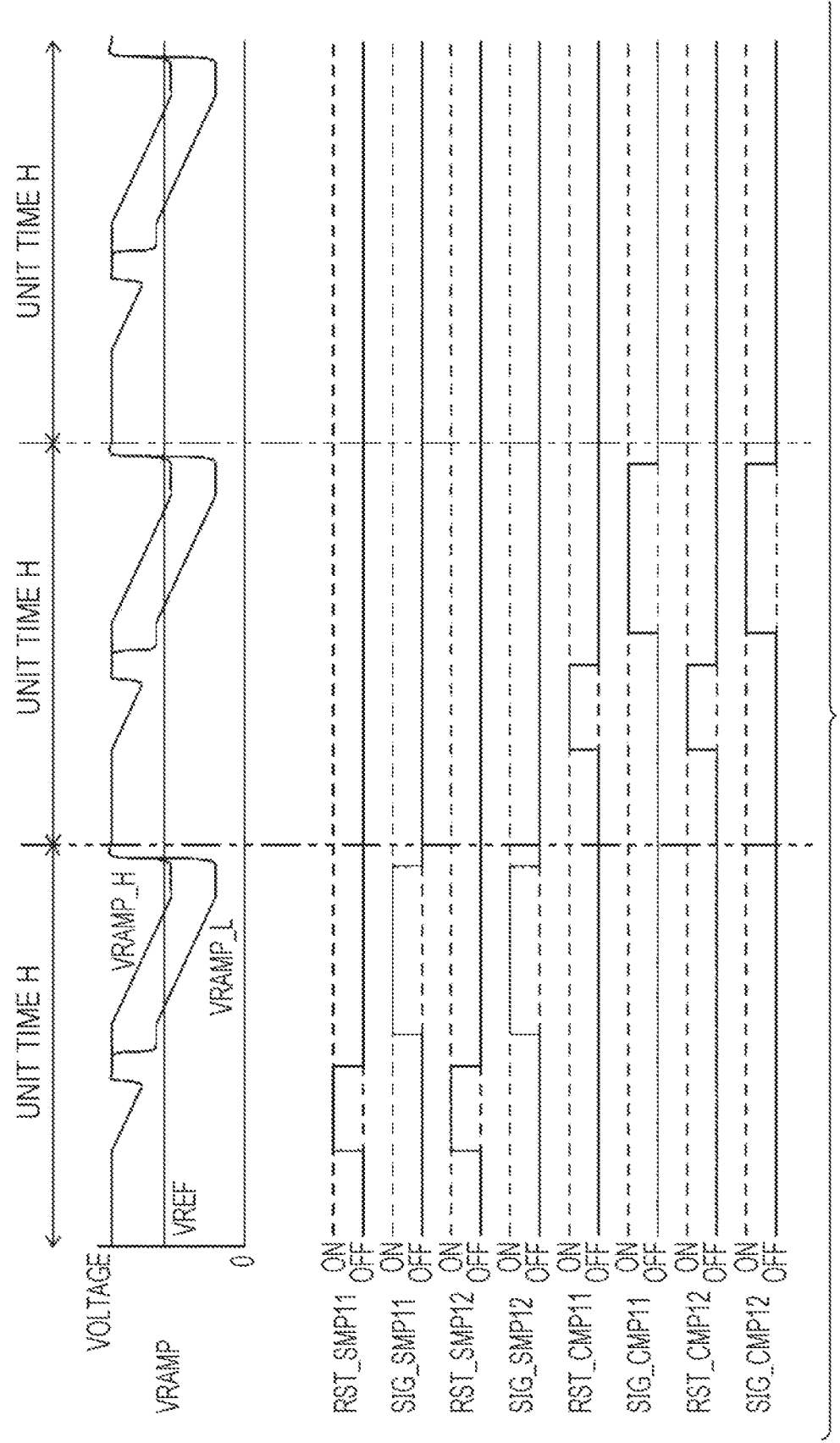

FIG. 10A and FIG. 10B illustrate a timing chart illustrating, for example, the on-off operation of the switches of each analog-to-digital converter 230 that is included in the solid-state imaging device 3. The operation of the analog-to-digital converter 230 will be described with reference to this.

The analog-to-digital converter 230 sequentially performs the operation of reading sets of the reset electric potentials and the signal electric potentials that are sequentially transmitted as the pixel output signals VSIG from the pixels 120 by using the three analog circuits 231a, 231b, and 231c. The reset electric potentials and the signal electric potentials of the pixels 120 that are stored in the three analog circuits 231a, 231b, and 231c are inputted into the analog-to-digital converter circuits 132 to perform the analog-to-digital conversion process. The readout process and the analog-to-digital conversion process are simultaneously processed.

During the first one unit time H, the analog circuit 231a performs the readout process for one of the pixels 120 in the k-th row. During the subsequent one unit time H, the analog circuit 231a performs the analog-to-digital conversion process by using the two analog-to-digital converter circuits 132a and 132b and the comparison signal VRAMP_H or VRAMP_L. The analog circuit 231a performs no process during the subsequent one unit time H.

The analog circuit 231b performs no process during the first one unit time H. During the subsequent one unit time H, the readout process for one of the pixels 120 in the (k+1)-th row is performed. During the subsequent one unit time H, the analog-to-digital conversion process for the pixel 120 in the (k+1)-th row is performed by using the two analog-to-digital converter circuits 132a and 132b and the comparison signal VRAMP_H or VRAMP_L.

During the first one unit time H, the analog circuit 231c performs the analog-to-digital conversion process for one of the pixels 120 in the (k−1)-th row by using the two analog-to-digital converter circuits 132a and 132b and the comparison signal VRAMP_H or VRAMP_L. During the subsequent one unit time H, no process is performed. During the subsequent one unit time H, the readout process for one of the pixels 120 in the (k+2)-th row is performed.

The cycle of the on-off operation of the switches is three unit times H. A process for a single pixel (the k-th row) that is performed during three unit times H will be described below, and the on-off operation of the switches that are included in the analog circuit 231a will be described below. The on-off operation of the switches that are included in the analog circuits 231b and 231c starts with timing that differs from that in the case of the analog circuit 231a by one unit time H or two unit times H and is performed in the same manner as that of the switches that are included in the analog circuit 231a, and a detailed description thereof is omitted.

Sampling Period of Electric Potential

Sampling of the reset electric potentials and the signal electric potentials during the first unit time H is the same as in the solid-state imaging device 2 according to the second embodiment, and a detailed description thereof is omitted herein.

Analog-to-Digital Conversion Period for Electric Potential

During the subsequent one unit time H, the analog-to-digital conversion of the reset electric potential and the signal electric potential of the pixel 120 in the k-th row is performed. The analog-to-digital converters 230 according to the present embodiment simultaneously perform analog-to-digital conversion by using the first analog-to-digital converter circuit 132a and the first analog-to-digital converter circuit 132b during the one unit time H. The analog-to-digital conversion that is performed by the first analog-to-digital converter circuits 132a and 132b is the same as that in the solid-state imaging device 2 according to the second embodiment, and a detailed description thereof is omitted herein.

Effects of Solid-State Imaging Device 3

The solid-state imaging device 3, which has the same circuit structure as that of each analog-to-digital converter 230 that is included in the solid-state imaging device 2 according to the second embodiment, can thus perform the analog-to-digital conversion of a single pixel output signal VSIG during one unit time H. Each analog-to-digital converter 230 that is included in the solid-state imaging device 2 or the solid-state imaging device 3 may thus perform the analog-to-digital conversion of a single pixel output signal VSIG during two unit times H or may perform the analog-to-digital conversion during one unit time H depending on the timing with which the switches that are included in the analog circuits 231 are switched.

In the solid-state imaging device 3 according to the present embodiment, the analog-to-digital converter 230 performs the analog-to-digital conversion of a single pixel output signal VSIG during one unit time H and can consequently decrease a period of time from pixel readout to the output of the result of the analog-to-digital conversion in the solid-state imaging device 3. In the solid-state imaging device 2 according to the second embodiment, however, the analog-to-digital converter 230 can output the results of the analog-to-digital conversion of the comparison signals VRAMP_H and VRAMP_L like a pipeline. Accordingly, after the processes of the analog-to-digital converter 230, a process of combining the results of the analog-to-digital conversion of the comparison signals VRAMP_H and VRAMP_L and a correction process that is performed by the corrector 170, for example, are readily pipelined. That is, a choice between the analog-to-digital conversion rate of the analog-to-digital converter 230 and pipelining of processes after the processes of the analog-to-digital converter 230 for, for example, noise reduction can be freely made, and the degree of freedom of design of a solid-state imaging device according to an embodiment of the present disclosure can be increased.

Summary

According to a first aspect of the present disclosure, a solid-state imaging device (1) includes pixels (120), a charge storage element (a capacitor C_RST, C_SIG) that temporarily stores voltage values of pixel output signals that are outputted from the pixels, a comparison signal generator (133) that generates comparison signals having voltage values that vary in a certain range from an upper limit to a lower limit with time, and a first analog-to-digital converter circuit (132a, 132b) that performs analog-to-digital conversion by comparing the voltage values that are stored in the charge storage element with the comparison signals. The comparison signal generator generates the comparison signals such that a waveform having a voltage value that ranges from the upper limit to the lower limit and that has linearity and continuity between the upper limit and the lower limit is formed by connecting waveforms that represent variation in the voltage values of the comparison signals with time to each other.

A solid-state imaging device according to a second aspect of the present disclosure may further include a reference voltage generator (150) that generates a reference voltage having a voltage value of both of two of the comparison signals having voltage values that partly overlap, and a second analog-to-digital converter circuit (160*a*, 160*b*) that performs analog-to-digital conversion by comparing the voltage value of the reference voltage with the comparison signals in the first aspect described above.

A solid-state imaging device according to a third aspect of the present disclosure may further include a corrector (170) that uses a value of a result of the analog-to-digital conversion performed by the second analog-to-digital converter circuit and that corrects a value of a result of the analog-to-digital conversion performed by the first analog-to-digital converter circuit in a manner in which the voltage values that are stored in the charge storage element and the comparison signals are compared in the second aspect described above.

A solid-state imaging device according to a fourth aspect of the present disclosure may include the first analog-to-digital converter circuits, and the first analog-to-digital converter circuits may simultaneously compare the voltage values that are stored in the charge storage element and the comparison signals in the first to third aspects described above.

In a solid-state imaging device (3) according to a fifth aspect of the present disclosure, the first analog-to-digital converter circuits may simultaneously compare a voltage value that is relevant to one of the pixel output signals and that is stored in the charge storage element and the comparison signals in the fourth aspect described above.

Additional Remarks

The present disclosure is not limited to the above embodiments, various modifications can be made within the scope of Claims, and an embodiment obtained by appropriately combining technical measures disclosed according to the different embodiments is also included in the technical scope of the present disclosure. A combination of the technical measures disclosed in the embodiments can form a new technical feature.

The present disclosure contains subject matter related to that disclosed in U.S. Provisional Patent Application No. 62/923,167 filed in the US Patent Office on Oct. 18, 2019, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
pixels;
a charge storage capacitor that temporarily stores voltage values of pixel output signals that are outputted from the pixels;
a comparison signal generator that generates comparison signals having voltage values that vary in a certain range from an upper limit to a lower limit with time; and
a first analog-to-digital converter circuit that performs analog-to-digital conversion by comparing the voltage values that are stored in the charge storage capacitor with the comparison signals,
wherein the comparison signal generator generates the comparison signals such that a waveform having a voltage value that ranges from the upper limit to the lower limit and that has linearity and continuity between the upper limit and the lower limit is formed by connecting waveforms that represent variation in the voltage values of the comparison signals with time to each other,
wherein the solid-state imaging device further comprising: a reference voltage generator that generates a reference voltage having a voltage value of both of two of the comparison signals having voltage values that partly overlap; and
a second analog-to-digital converter circuit that performs analog-to-digital conversion by comparing the voltage value of the reference voltage with the comparison signals.

2. The solid-state imaging device according to claim 1, further comprising: a correcting circuitry that uses a value of a result of the analog-to-digital conversion performed by the second analog-to-digital converter circuit and that corrects a value of a result of the analog-to-digital conversion performed by the first analog-to-digital converter circuit in a manner in which the voltage values that are stored in the charge storage capacitor and the comparison signals are compared.

3. The solid-state imaging device according to claim 1, further comprising: a plurality of the first analog-to-digital converter circuits,
wherein the plurality of the first analog-to-digital converter circuits simultaneously compare the voltage values that are stored in the charge storage capacitor and the comparison signals.

4. The solid-state imaging device according to claim 3, wherein the plurality of the first analog-to-digital converter circuits simultaneously compare a voltage value that is relevant to one of the pixel output signals and that is stored in the charge storage capacitor and the comparison signals.

* * * * *